United States Patent

Fournel

[11] Patent Number: 5,602,500
[45] Date of Patent: Feb. 11, 1997

[54] CIRCUIT FOR THE DETECTION OF VOLTAGE THRESHOLDS

[75] Inventor: Richard P. Fournel, Trets, France

[73] Assignee: SGS-Thomson Microelectronics, S. A., Gentilly Cedex, France

[21] Appl. No.: 54,939

[22] Filed: Apr. 28, 1993

[30] Foreign Application Priority Data

Apr. 30, 1992 [FR] France .................................. 92 05418

[51] Int. Cl.$^6$ ............................................. H03K 1/12
[52] U.S. Cl. ................. 327/77; 327/530; 327/576; 327/78; 327/79; 327/50; 327/81; 327/63; 327/55; 327/143
[58] Field of Search ............................ 307/354, 296.7, 307/296.6, 296.1, 296.4, 296.5; 327/79, 78, 80, 81, 20, 55, 58, 59, 62, 63, 77, 50, 530, 541, 546, 143, 535, 576

[56] References Cited

U.S. PATENT DOCUMENTS

| | | | |
|---|---|---|---|
| 3,508,081 | 4/1970 | Matsuda | 307/296.6 |
| 3,681,623 | 8/1972 | Hoffman, Jr. et al. | 307/296.8 |
| 3,733,498 | 5/1973 | Watson et al. | 307/296.6 |
| 4,558,232 | 12/1985 | Simpson | 307/354 |
| 4,857,769 | 8/1989 | Kotera et al. | 307/450 |
| 4,983,857 | 1/1991 | Steele | 307/272.3 |
| 5,140,183 | 8/1992 | Takenaka | 307/296.4 |

*Primary Examiner*—Timothy P. Callahan
*Assistant Examiner*—Dinh T. Le
*Attorney, Agent, or Firm*—Betty Formby; Robert Groover

[57] ABSTRACT

A circuit to detect the crossing of at least one voltage threshold by an input voltage of an integrated circuit has two arms mounted in negative feedback configuration, each comprising a forward biased diode in series with a current generator. The current generator of an arm is controlled in voltage by the other arm. An inverter calibrated to detect a crossing of a given threshold is connected at input to the connection point between the diode and the generator of one of the arms.

29 Claims, 6 Drawing Sheets

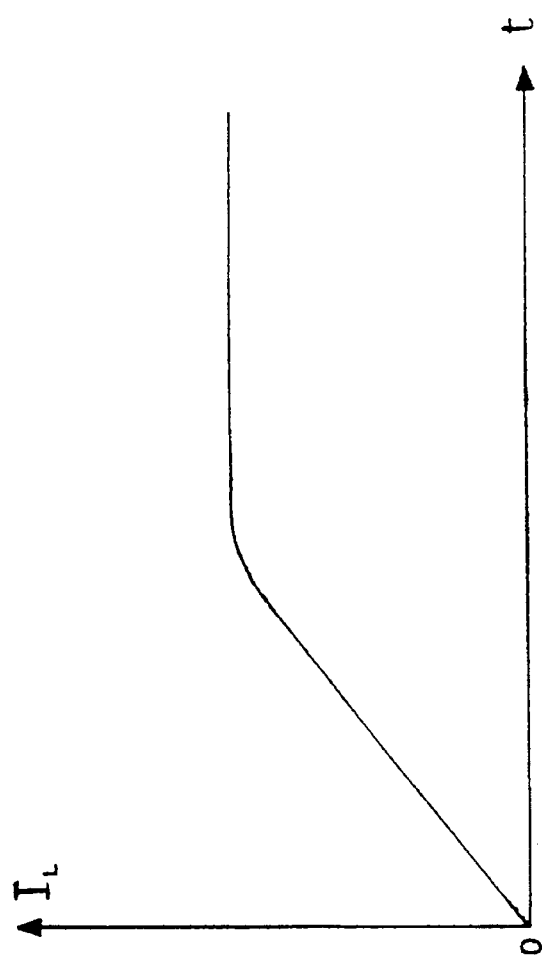
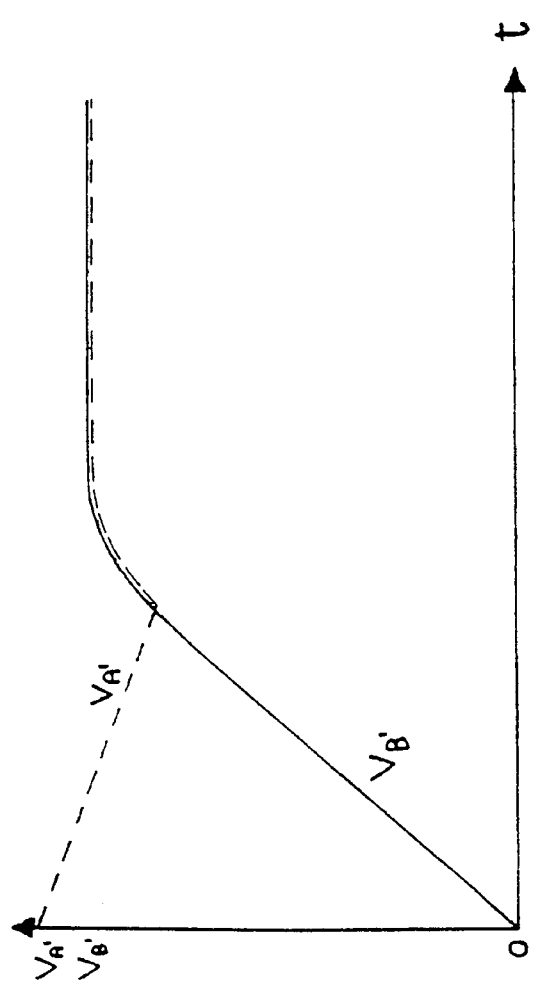

CIRCUIT FOR THE DETECTION OF VOLTAGE THRESHOLDS

CROSS-REFERENCE TO RELATED APPLICATION

This application claims priority from French App'n 92-05418, filed Apr. 30, 1992, which is hereby incorporated by reference.

BACKGROUND AND SUMMARY OF THE INVENTION

The invention relates to an electronic circuit for the detection of a voltage level that is above or below a given voltage threshold.

The invention can be applied notably to integrated circuits and very particularly to integrated circuits that work with confidential data and are known as "protected" or "security-locked" circuits.

BACKGROUND

Smart Cards

It has long been recognized that it would be extremely useful to have portable data carriers which were both secure and rewritable. Such carriers would be extremely useful as paperless checkbooks, or as credit cards which did not require telephone verification, or for a variety of controlled-access or pay-per-access applications.

However, it is not easy to satisfy both of these objectives. Much engineering work has been expended in attempting to develop portable data carriers (often referred to as "smart cards" or "chip cards") which would meet these objectives. At a minimum, such a carrier needs some rewritable non-volatile memory (such as EEPROM or battery-backed CMOS), plus some complex programmable logic (normally a microprocessor) which can run algorithms for security verification routines. Since many applications would be very attractive targets for fraud, determined and skilled efforts at intrusion must be expected.

Even with this general approach, significant effort is still needed to retain security. For example, simple techniques for reverse-engineering digital systems are well known, and a determined intruder can easily cut open a smart card, attach probes to the leads, and see what signals appear.

Steps can be taken to detect opening of the package, and to prevent access to (or even to destroy) the secure data. Similarly, algorithmic safeguards can be designed into the system as a whole, so that (for example) the card sends out only encrypted data, or only sends out its data in response to an encrypted password sent to the card by an interrogating station, or has multiple levels of access security. However, there is still a great need for improved security, and this continues to be a very active area of development.[1]

Among the more sophisticated approaches which an intruder may use is operation of the integrated circuit outside of its normal parameter envelope.[2] Operation outside the specified parameter envelope may produce unreliable operation, but unreliable operation may be just what an intruder wants: unreliable operation may permit some of the chip's security features to be more easily defeated. [1]Some of the history of work in this area is shown by U.S. Pat. Nos. 3,906,460; 3,934,122; 4,001,550, 4,007,355, 4,105,156, 4,197,986, 4,499,556; 4,612,413; 4,816,653; 4,816,654; 4,855,690; 4,882,474; 4,890,263; 4,943,804; 4,985,921; 5,010,331; 5,093,862; 5,120,939; and 5,146,499; and references cited therein; all of which are hereby incorporated by reference. [2]For example, the specifications for an integrated circuit will normally specify maximum and minimum supply voltage, clock frequency, and temperature.

BACKGROUND

Supply-Voltage Monitoring

It is useful to have the ability, by electronic means, to permit or prohibit the use of an integrated circuit depending on whether the level of the supply voltage that it receives at input comes within a specified range of values. A range such as this is delimited typically by a low threshold and a high threshold. The reliability of the circuit (depending on its conditions of operation) may be lost if the supply voltage is not in the range specified by the builder. Under this condition an unwanted operation may become possible, e.g. an unwanted programming operation, or an operation may go wrong and there may be, for example, an erroneous reading. A situation may also arise where the chip's security lock systems become ineffective: fraudulent activities then become possible.

Integrated circuits have therefore been designed incorporating a circuit for the detection of the crossing of threshold voltages. Known circuits of this type typically compare the output of a resistive divider with a reference voltage. They can be used to detect an excess of voltage (supply voltage above the high threshold) or a shortfall of voltage (supply voltage below the low threshold).

However, these prior detection circuits typically suffer from substantial dependence of the detection threshold on the ambient temperature of the integrated circuit into which they are incorporated. Their detection threshold also often varies with the method of manufacture. Moreover, the detection threshold will vary from one detection circuit to another, even under a given set of operating conditions. In one numerical example, for a nominal input voltage of 5 volts, these circuits enable the detection, at best, of a threshold of four volts, plus or minus 1 volt. In practice, the known detection circuits are appropriate for standard integrated circuits, but do not meet the stringent requirements of security-locked circuits with efficiency.

Attempts have also been made to perform supply-voltage monitoring using Zener diodes as a voltage reference. However, the minimum Zener voltage typically has a larger magnitude than is desired for supply-voltage monitoring.

Attempts have also been made to perform supply-voltage monitoring using a bandgap voltage reference. However, many such circuits cause significant power consumption, and are not convenient to implement in every process.

Innovative Circuits and Smart-Card

The disclosed innovations provide a detection circuit with two arms, each including a current generator controlled in constant voltage by the other arm. Each arm further comprises at least one forward biased diode. The circuit thus obtained is used to keep a constant current in each arm. Thus, the variation in voltage is taken, in each arm, to a determined point of this arm. An output stage that is connected at input to either one of the arms and is calibrated appropriately, enables the detection of the crossing of a given voltage threshold. It gives a binary response (zero or one) indicating whether the position of the supply voltage is above or below this threshold.

The disclosed innovative circuit, owing to its principle of reaction between two arms, makes it possible advantageously to detect a voltage threshold with high precision.

According to innovative teachings disclosed herein, there is provided: A circuit to detect supply voltage excursions, which comprises two detection arms connected between the supply voltage and the ground, each of these arms comprising a current generator and at least one forward biased diode. The current generator of each arm is controlled by the voltage of the connection point between the diode and the current generator of the other arm. The current generator and diode are preferably connected in opposite order in the two arms. An output stage is driven by a connection point between a diode and a current generator. (More preferably, two output stages with different thresholds are used.) At output, it delivers the information on the crossing of the threshold by the supply voltage.

In the sample implementation of FIG. 1, G1 and G2 are constant current sources,[3] which maintain a constant current through the diodes D1 and D2. With this bias current applied, the diodes will each maintain a substantially constant voltage drop. The substantially constant voltage drop of each branch is then fed back to keep the current generator of the other branch properly biased.

In the preferred embodiment, each diode is preferably configured as two transistors of opposite channel types, each with gate and drain connected, and in series with each other, to provide a constant voltage drop $V_{TP}+V_{TN}$ which is stable over a wide range of temperatures.

According to innovative teachings disclosed herein, there is also provided: An integrated circuit, comprising: connections for first and second power supply voltages; a first node connected to said first power supply voltage through a first constant-bias-potential element, and connected to said second power supply voltage through a first controlled current source; a second node connected to said second power supply voltage through a second constant-bias-potential element, and connected to said first power supply voltage through a second controlled current source; said first node being connected to said control said second controlled current source, and said second node being connected to said control said first controlled current source; first and second logic gates, having different respective threshold voltages, and connected to be driven by said first and second [3]They are intended to function in the "saturation" region, where the current is set by the gate-source voltage, and remains substantially constant over a wide range of Drain-Source voltages. By maintaining a constant gate-source voltage (in this invention by applying a constant diode voltage), a constant current may be set with accuracy. nodes respectively; whereby outputs of said first and second logic gates jointly indicate whether the difference between said first and second supply voltages is below, within, or above a predetermined range.

According to innovative teachings disclosed herein, there is also provided: An integrated circuit, comprising: connections for first and second power supply voltages; a first node connected to said first power supply voltage through a first constant-bias-potential element, comprising two transistors of opposite conductivity types connected in series, and connected to said second power supply voltage through a first controlled current source; a second node connected to said second power supply voltage through a second constant-bias-potential element, comprising two transistors of opposite conductivity types connected in series, and connected to said first power supply voltage through a second controlled current source; said first node being connected to said control said second controlled current source, and said second node being connected to said control said first controlled current source; first and second logic gates, having different respective threshold voltages, and connected to be driven by said first and second nodes respectively; whereby outputs of said first and second logic gates jointly indicate whether the difference between said first and second supply voltages is below, within, or above a predetermined range.

According to innovative teachings disclosed herein, there is also provided: A CMOS integrated circuit, comprising: connections for first and second power supply voltages, said first supply voltage being more positive than said second supply voltage; a first node connected to said first power supply voltage through a first diode-connected element comprising two field-effect transistors in series, and connected to said second power supply voltage through a first controlled current source; a second node connected to said second power supply voltage through a second diode-connected element comprising two field-effect transistors in series, and connected to said first power supply voltage through a second controlled current source; said second controlled current source including at least one PMOS transistor having a gate operatively connected to said first node, and said first controlled current source including at least one NMOS transistor having a gate operatively connected to said second node; first and second logic gates, having different respective threshold voltages, and connected to be driven by said first and second nodes respectively; whereby outputs of said first and second logic gates jointly indicate whether the difference between said first and second supply voltages is below, within, or above a predetermined range.

According to innovative teachings disclosed herein, there is also provided: A smart-card controller circuit, comprising a supply voltage monitoring circuit as above in combination with: security logic which monitors the outputs of said voltage monitoring circuit; a rewritable nonvolatile memory; and a programmable CPU (central processing unit) which controls access to said memory.

According to innovative teachings disclosed herein, there is also provided: A smart-card controller integrated circuit, comprising a supply voltage monitoring circuit as above in combination with: at least one fuse; security logic which monitors the outputs of said voltage monitoring circuit and of said fuse; a read-only memory; a rewritable nonvolatile memory; and a programmable CPU (central processing unit) which is connected to execute programs from said read-only memory, and which controls access to said rewritable nonvolatile memory.

According to innovative teachings disclosed herein, there is also provided: A method for detecting power-supply overvoltage and undervoltage, comprising the steps of: sourcing current from a first power supply voltage through a first constant-bias-potential element to a first controlled current source which is connected to a second power supply voltage; sourcing current from said first power supply voltage through a second controlled current source to a second constant-bias-potential element which is connected to said second power supply voltage; controlling the current of said second current source by a voltage taken from a first node which is intermediate between said first current source and said first constant-bias-potential element; controlling the current of said first current source by a voltage taken from a second node which is intermediate between said second current source and said second constant-bias-potential element; driving first and second logic gates with the respective voltages of said first and second nodes, said first and second logic gates having different respective threshold voltages; and connecting the respective outputs of said first and second logic gates to indicate whether the difference between said first and second supply voltages is below, within, or above a predetermined range.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
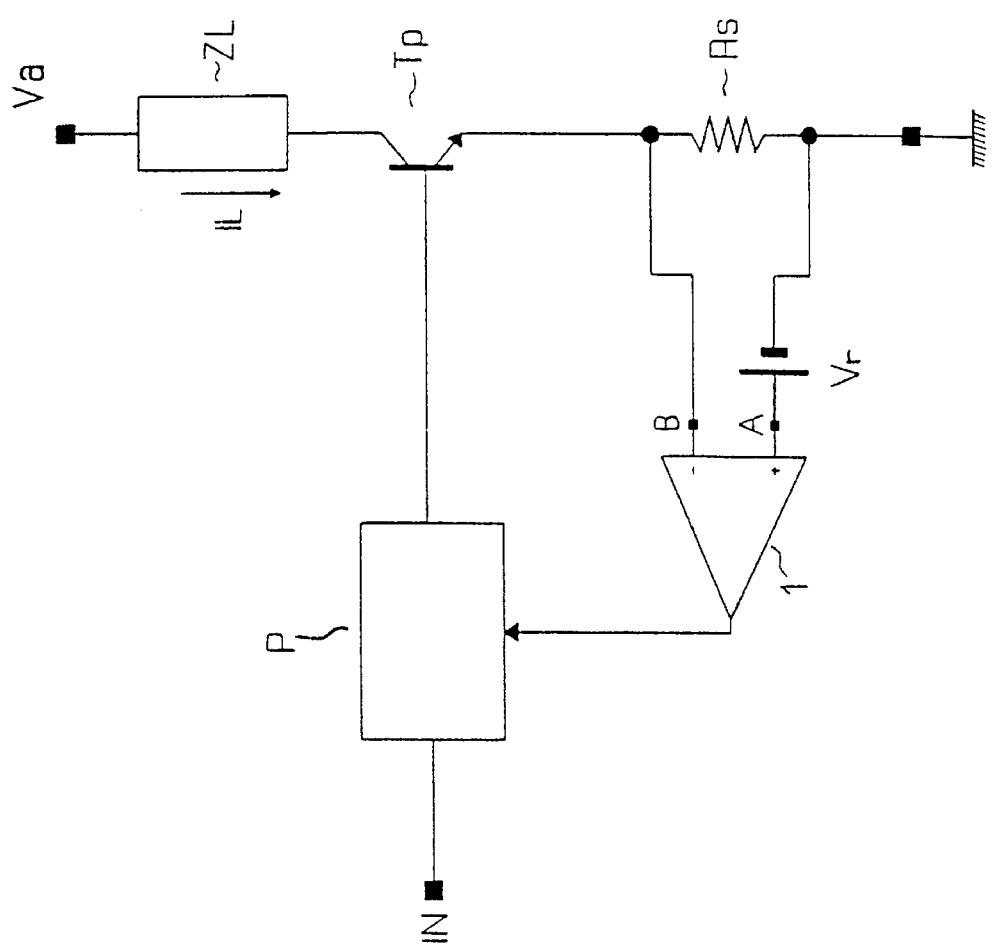
FIG. 1 is a schematic diagram illustrating some principles of the invention.

FIG. 1 shows the principle of the invention. It shall be noted that here below all the potentials are referenced with respect to the ground.

The electronic circuit comprises three blocks:

an output stage, a first arm comprising a diode D1, the anode of which is connected to the supply voltage to be monitored, Vdd, and to a current generator G1 connected between the cathode of the diode and the ground, a second arm comprising a current generator G2 connected between Vdd and the anode of a diode D2, the cathode of which is connected to the ground.

The term "midpoint of an arm" refers to the connection point between the diode and the current generator of this very same arm. Thus V 1 designates the midpoint of the first arm and V2 designates the midpoint of the second arm. The current generator G1 is voltage controlled by the midpoint of the second arm. The current generator G2 is voltage controlled by the midpoint of the first arm. Furthermore, the input of the output stage is connected to the midpoint V1. The output of the output stage delivers the information on the crossing of the threshold that is to be detected. The output stage is preferably an inverter, but may alternatively be a logic gate such as a NOR gate or a NAND gate.

The principle of the invention is then as follows: when the circuit is balanced, the diode of each of the arms is biased at a constant potential by the constant current delivered by the current generator of the arm. Let us assume then that the supply voltage Vdd varies, for example let us assume that it drops. Since the diode D1 of the first arm is biased at constant current, the variation in voltage of the first arm is taken to between the midpoint V1 and the ground. Thus, the midpoint V1 will follow the variations in supply voltage Vdd. Now, the midpoint V1 controls the current generator G2 of the second arm in voltage. The difference in potential between V1 and Vdd is constant since V1 varies as Vdd. The current generator G2 will therefore give a constant current independently of the variation in the supply voltage Vdd. Consequently, the midpoint V2 has a constant potential that does not vary with Vdd. The midpoint V2 supplies voltage to the current generator G 1 which therefore gives a constant current in the first arm. The variation in the supply voltage Vdd is taken to the midpoint V1. In the example of FIG. 1, the midpoint V1 controls the input of a calibrated inverter to make it flip over for a particular value of potential.

The inverter could very well have been placed at output of the midpoint V2. In this case the potential V2, as has been seen, is constant, independently of the variations in the supply voltage Vdd. However, the inverter has, as its reference, the supply voltage Vdd, and it is the difference in potential between the supply voltage Vdd and the potential of the midpoint V2 that, in this case, activates the changeover of the inverter.

Generally speaking, the principle of the invention enables the detection of two thresholds with an output stage that is calibrated for a certain threshold and is connected to V1 and another output stage that is calibrated for another threshold and is connected to V2.

Figure 2:
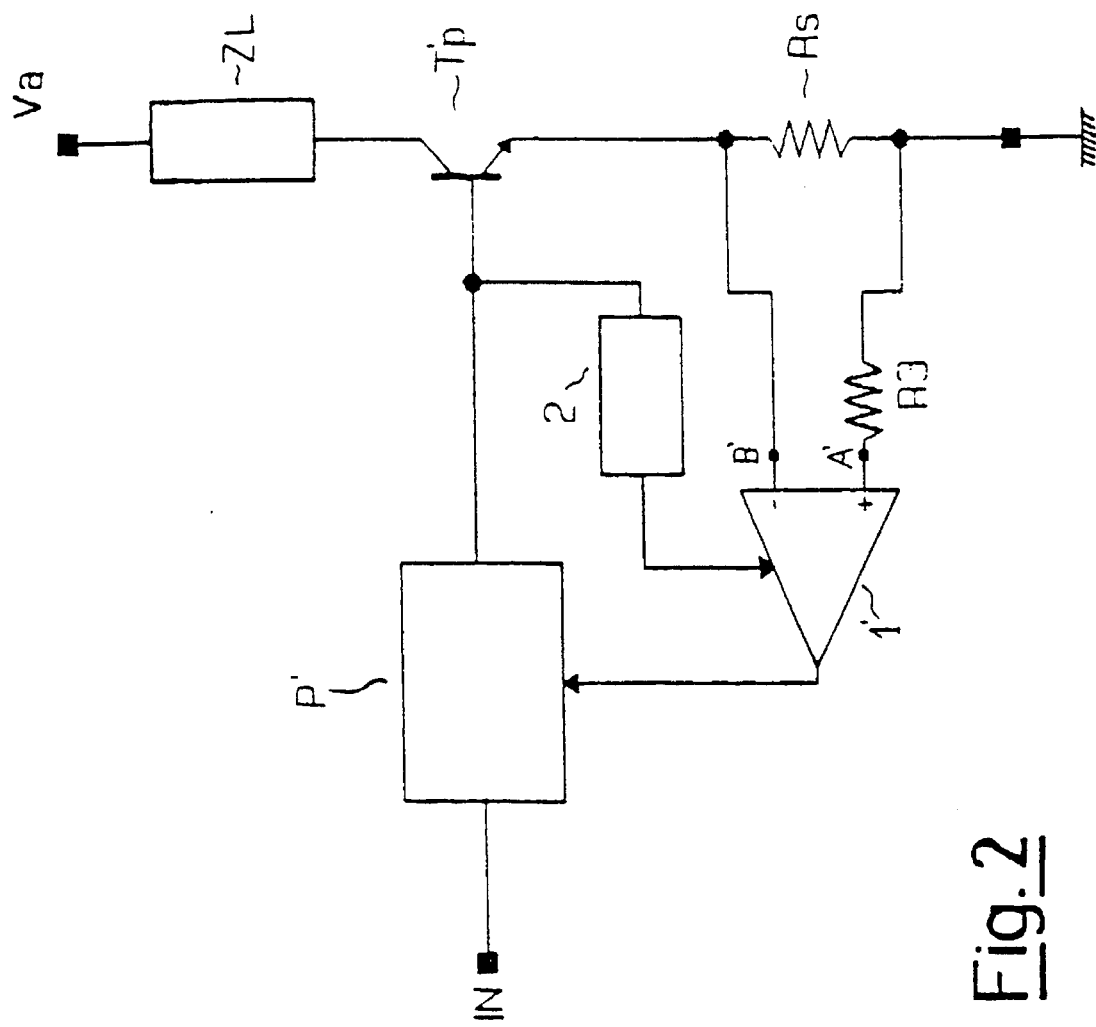
FIG. 2 shows a preferred CMOS embodiment of the invention.

A preferred embodiment is shown in FIG. 2. In the first arm, the current generator G1 is preferably an N type transistor with its drain connected to the midpoint V1 and its source connected to the ground. Advantageously, it is biased in saturation. The diode D1, for its part, is formed by two series-connected transistors, a first P type transistor Tp3 and a second N type transistor Tn3. These two transistors are mounted as a forward biased diode. Thus, the source of the transistor Tp3 is connected to Vdd and the source of the transistor Tn3 is connected to V1. The gate and the drain of each of these transistors are connected together. The drain of the transistor Tp3 is furthermore connected to the drain of the transistor Tn3.

In the second arm, the current generator G2 is preferably a P type transistor, the source of which is connected to Vdd and the drain of which is connected to the midpoint V2. Advantageously, it is biased in saturation. The diode D2 is preferably formed by two transistors, one P type transistor Tp4 and one N type transistor Tn4. Both of them are mounted as forward biased diodes. Thus the source of the transistor Tp4 is connected to the midpoint V2 and the source of the transistor Tn4 is connected to the ground. The drain and the gate of each transistor are connected together. The drain of the transistor Tn4 is connected to the drain of the transistor Tp4.

A first inverter I1 has its input connected to the midpoint V1. In the example shown in FIG. 2, this inverter I1 is a CMOS inverter comprising a P type transistor Tp1 and an N type transistor Tn1. In a known way, the drain of the transistors Tp1 and Tn1 are connected together and form the output OUT1 of the inverter I1. The gates of the transistors Tp1 and Tn1 are connected together and form the input of the inverter connected to the midpoint V1. Finally, the source of the transistor Tp1 is connected to Vdd and the source of the transistor Tn1 is connected to the ground. A second inverter I2 has its input connected to the midpoint V2. In the example shown in FIG. 2, this second inverter I2 is a CMOS inverter comprising a P type transistor Tp2 and an N type transistor Tn2. In a known way, the drains of the transistors Tp2 and Tn2 are connected together and form the output OUT2 of the inverter I2. The gates of the transistors Tp2 and Tn2 are connected together and form the input of the inverter connected to the midpoint V2. Finally, the source of the transistor Tp2 is connected to Vdd and the source of the transistor Tn2 is connected to the ground.

In one example, the working hypothesis is that the inverter I1 is calibrated to detect a low level of the supply voltage Vdd and the inverter I2 is calibrated to detect a high level of this same voltage. In particular, the sizes of the transistors of the inverters are chosen to enable the detection of the desired thresholds.

In the case of the inverter I1 which has to detect a low threshold, it is known, as has been seen in the explanation of the principle of the invention, that the midpoint V1 will follow the variations of the supply voltage Vdd. Thus, the difference in potential between the gate and the source of the transistor Tp1 of the inverter I1 does not vary. Hence, for the inverter to switch over, the transistor Tn1 should come on or go off, depending on the difference in potential between its gate and its source, i.e. depending on the value of the potential of the midpoint V1. Thus, so long as Vdd does not fall below the low threshold, the transistor Tp1 is conductive and the transistor Tn1 is conductive: the output OUT1 of the inverter I1 is at zero. When the voltage Vdd falls below the low threshold (shortfall), the potential of the midpoint V1 falls below the conduction threshold of the transistor Tn1 of the inverter I1: the transistor Tn1 goes off, the inverter I1 changes over and the output of the inverter goes to 1.

For the inverter I2, the conditions are different, since it is necessary to detect a high supply threshold and since, in the example of FIG. 2, the potential of the input of the inverter is constant. Only the supply voltage Vdd may vary.

The transistor Tp2 of the inverter I2 has its source connected to Vdd and its gate connected to the midpoint V2. The voltage V2 is constant. The difference in potential between the source and the gate of the transistor Tp2 varies therefore with Vdd. The transistor Tn2 has its gate connected to the midpoint V2 and its source connected to the ground. The difference in potential between the source and the gate of the transistor Tn2 is therefore constant. The state of Tp2 will therefore control whether inverter I2 switches. Since a high supply threshold is to be detected, the inverter is calibrated so that, for a voltage Vdd below the high supply threshold, the potential V2 is greater than the difference in potential between Vdd and the conduction threshold of the transistor Tp2. If this is the case, transistor Tp2 is off, and the output of the inverter I2 is at 0. If the voltage Vdd goes beyond the upper threshold, the difference in potential between Vdd and V2 increases, so that the threshold voltage of transistor Tp2 is exceeded. Thus, the transistor Tp2 goes off, inverter I2 changes state, and the output OUT2 of the inverter I2 goes to 1.

It is also possible to design the system so that the inverter I1 detects a high threshold and the inverter I2 detects a low threshold. The inverters will be calibrated according to the desired detection. The disclosed inventions, which make it possible to maintain a constant current in each of the arms, thus lead to a reliable detection of the supply voltage thresholds.

Preferably, and as described here above, the diode D1 of the principle of the invention is made by two transistors having opposite types of conduction. It is indeed known that the characteristics of the transistors, and notably their conduction threshold, varies with the manufacturing method and with the temperature. It is also known that these variations are opposite variations in a P type transistor and in an N type transistor. Thus, to obtained improved thermal compensation and compensation for variations in process, it is preferred to use two transistors, of opposite types, in series to form the diode D1. Thus, the potential V1 will follow the variations of Vdd more closely, and the potential V2 will remain as constant as possible.

The detection level is set, in practice, with the adjusting of the current generators to achieve the accurate biasing of the diodes of each of the arms and with the sizes of the transistors of the inverters to adjust the change-over threshold to these potentials V1, V2. The current generators and the sizes of the transistors of the inverters are computed according to the usual methods as a function of the level of the voltage to be monitored and of the low and/or high thresholds to be detected.

The principle of the invention and its preferred embodiment enable very reliable detection confirmed by simulations which show, for example, that for a supply voltage Vdd of 5 volts, a high threshold of 5.5 volts and a low threshold of 4.5 volts, it is possible to detect these thresholds to within +0.35 volts over the full temperature range from –40° C., to 80° C. and over the full range of permissible VT variation in a sample process. This is an appreciable improvement compared with present approaches, which show variations of the order of at least ±1 volt. Thus, the disclosed innovative circuits provide enhanced protection of the security-locked circuits.

Figure 3:
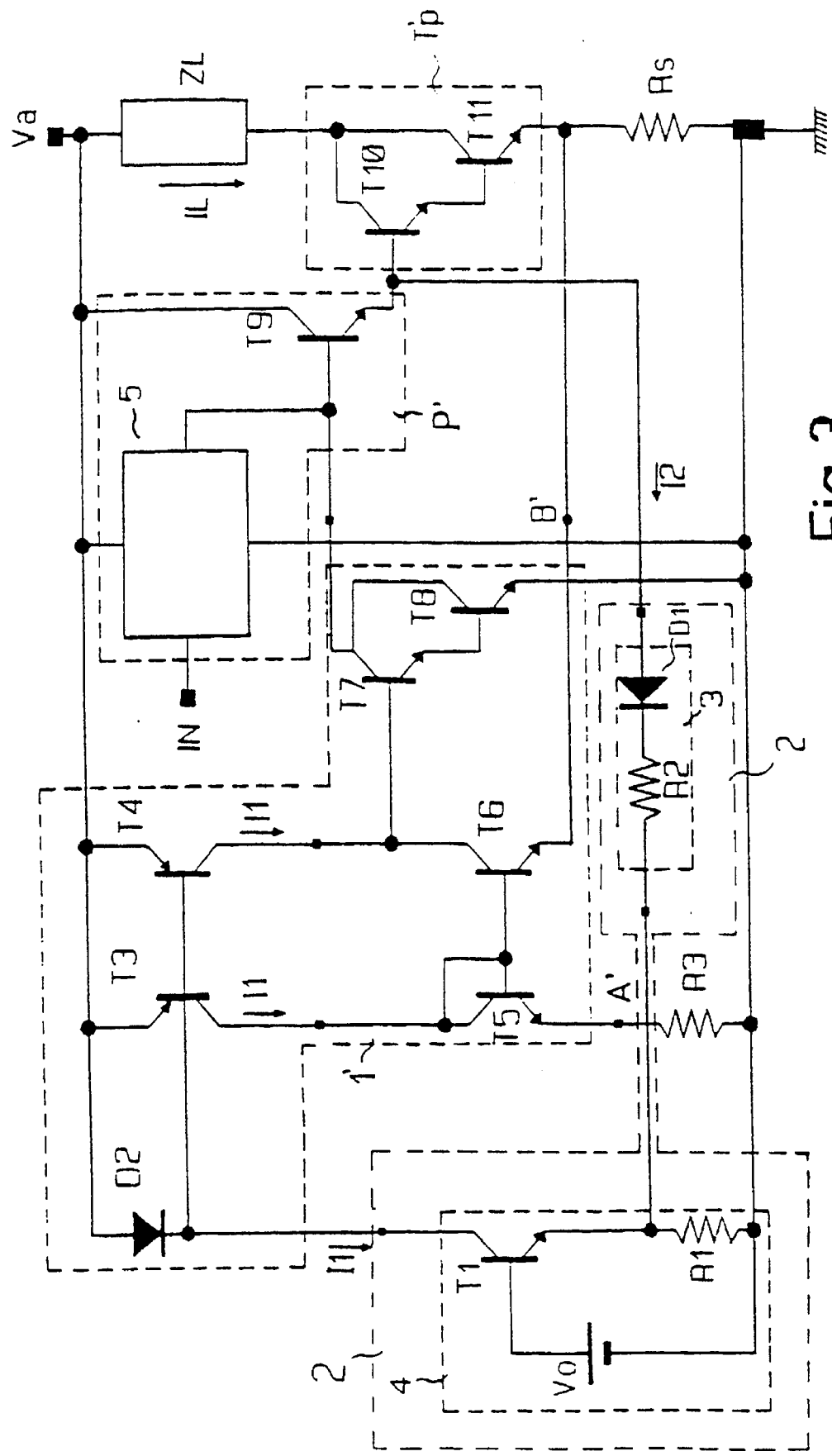
FIG. 3 shows the preferred W/L values used in a sample implementation of the circuit of FIG. 2.

FIG. 3 shows the preferred W/L values used in a sample implementation of the circuit of FIG. 2. Of course, these W/L values could be varied, or other devices could be added.

Figure 4:
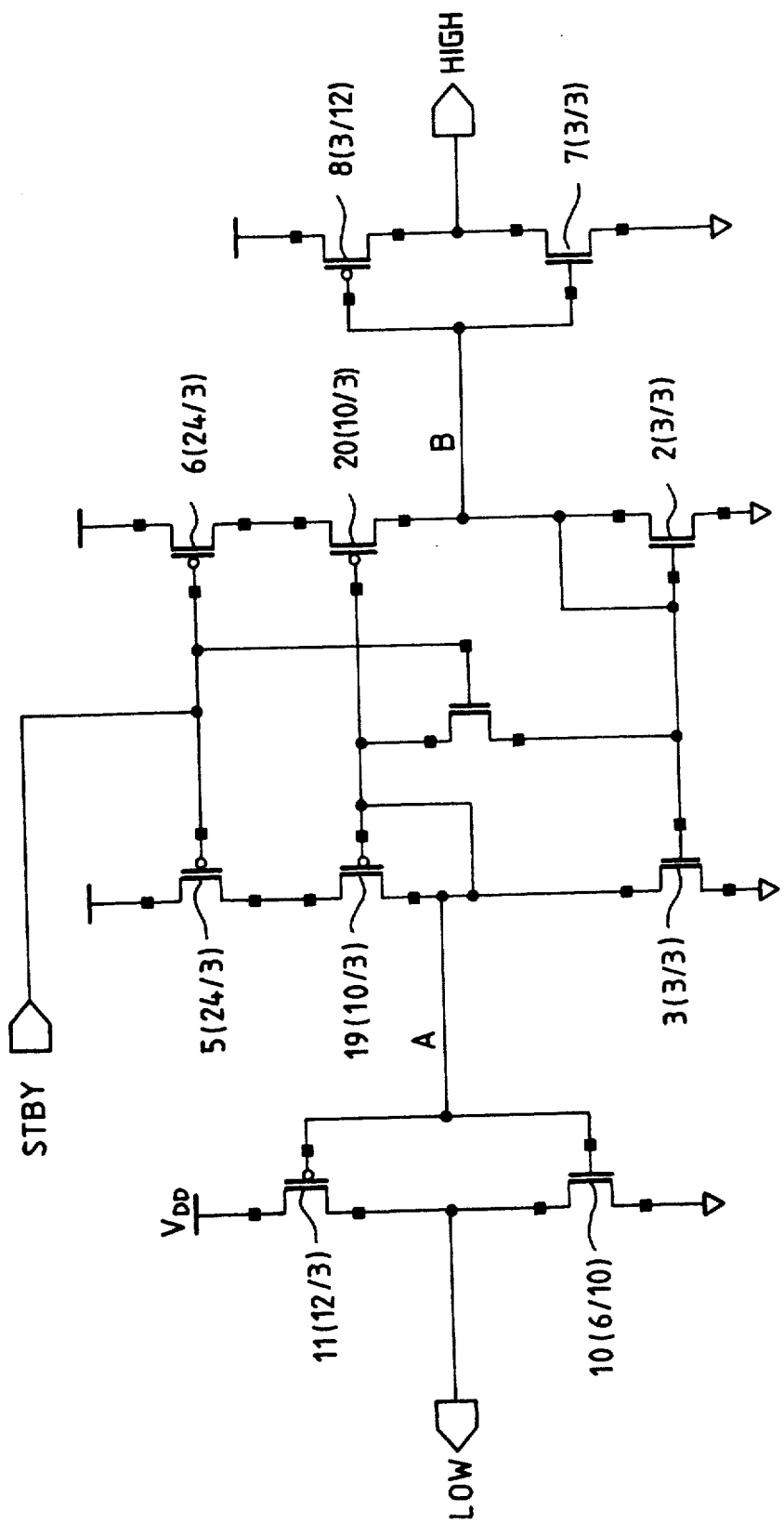
FIG. 4 shows another sample implementation of the invention.

FIG. 4 shows another sample implementation of the invention. Note that, in this embodiment, NMOS diodes are used instead of the back-to-back PMOS+NMOS diodes of FIG. 2. Note also that a signal STBY is connected to disable the operation of the circuit.

Figure 5:
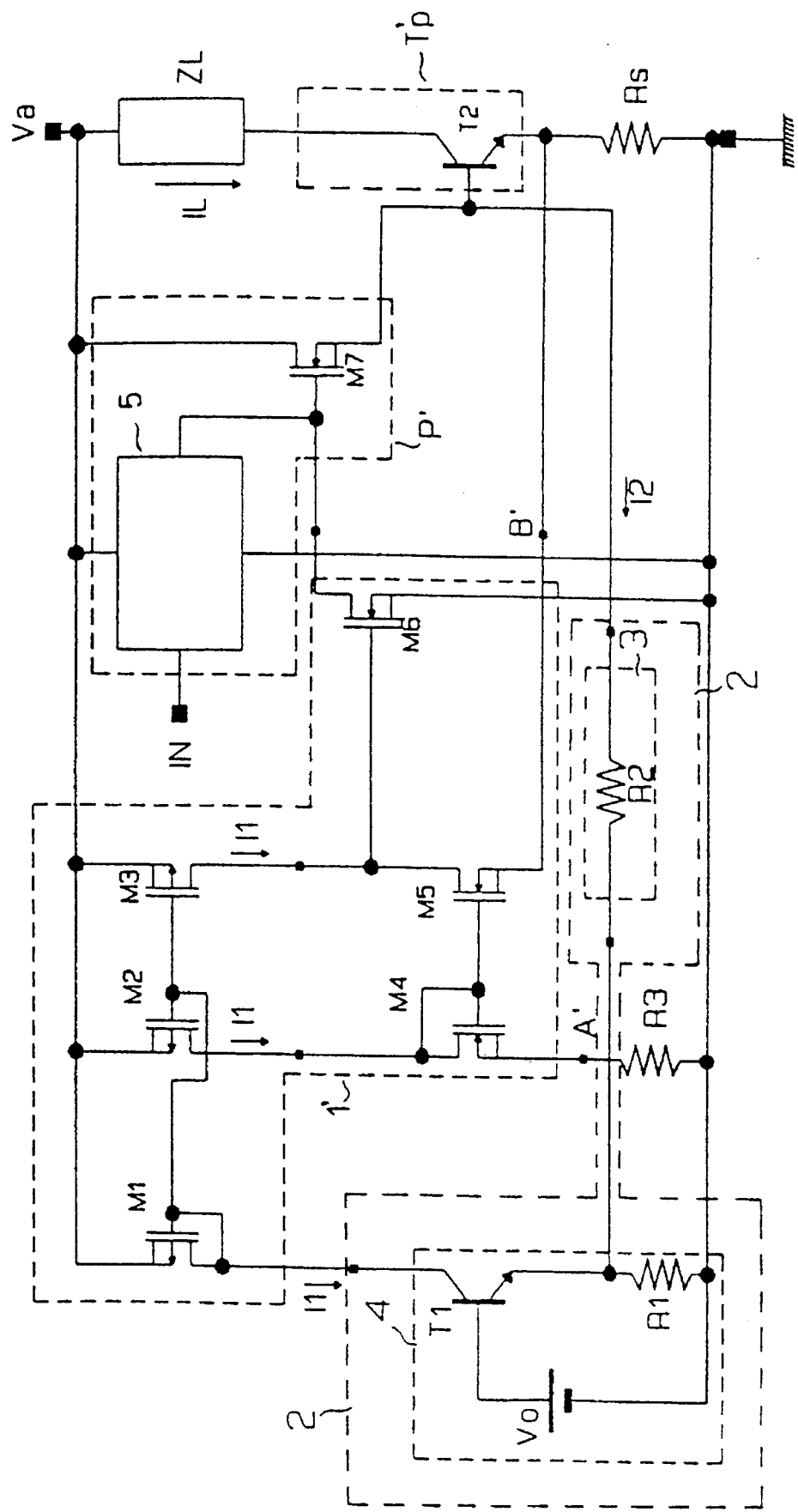
FIG. 5 shows an example of a smart card controller chip, in which a voltage detector according to the present invention can advantageously be included in the security circuits.
Figure 6:
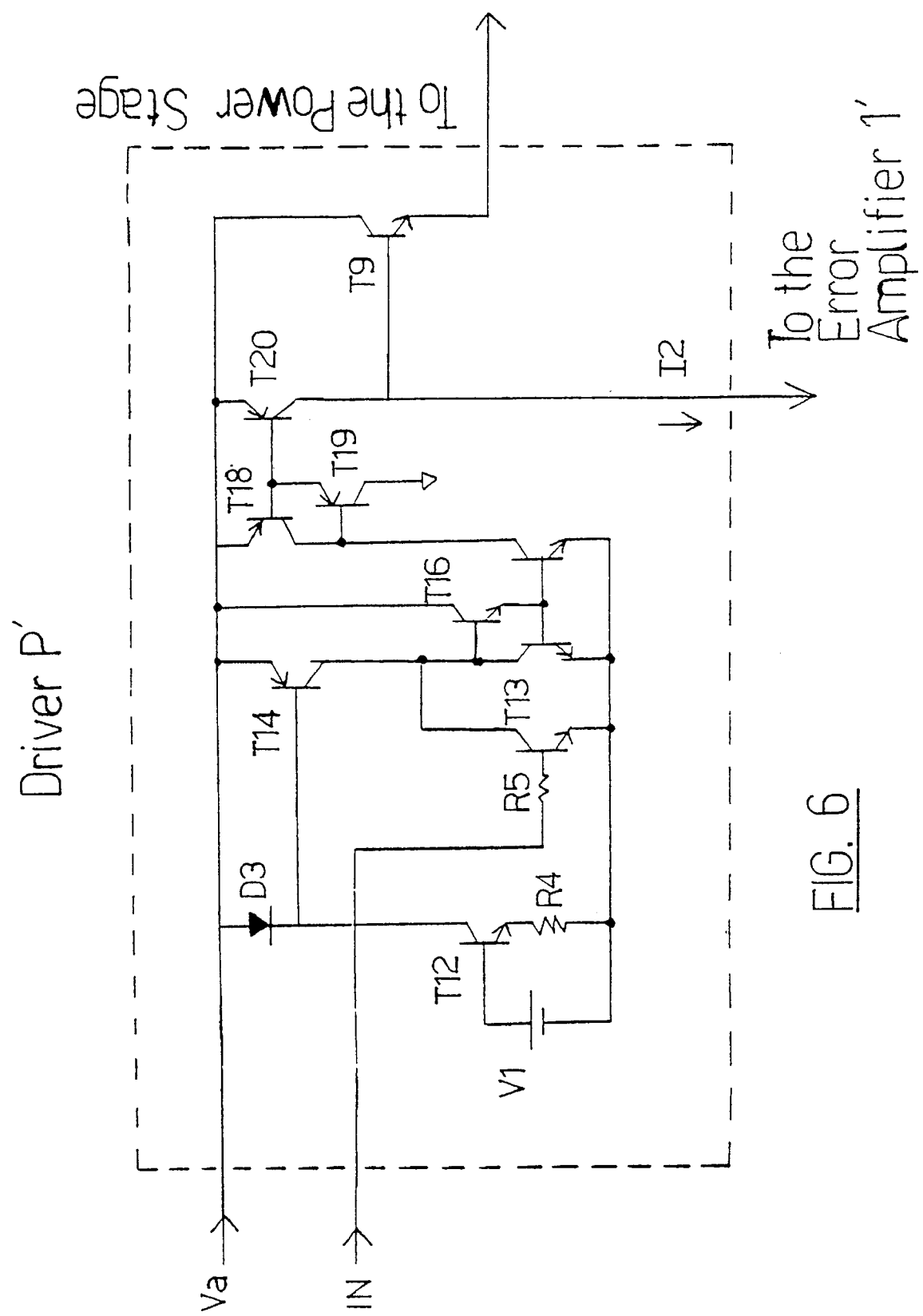

FIG. 5 shows an example of a smart card controller chip, in which a voltage detector according to the present invention can advantageously be included. In this sample implementation, the circuit of FIG. 1 is used to achieve a smart-card architecture with increased security. This is a serial access microcontroller perfectly suited to applications where low voltage or low power consumption are mandatory. On chip memories include up to 1K bytes of RAM, up to 16K bytes of ROM, and up to 6K bytes of EEPROM. Note that an on-chip high-voltage generation circuit is also included, to provide programming voltage Vpp when writes to the EEPROM are desired.

An 8-bit microcontroller CPU 510 is interconnected, through internal bus 520, to RAM 532, ROM 534, latches 522, EEPROM 536, I/O interface circuit 550, and security logic 560. The interface circuit 550 is connected to operation the serial port 552. Test logic 540 is also provided, for circuit testing after fabrication.

Operation in most respects is conventional, except that the security logic 560 provides extensive protection against out-of-limits operating conditions. This is accomplished using detectors 562, which monitor not only supply voltage (using a circuit like that of FIG. 2), but also clock frequency, temperature, and exposure to light. Moreover, the detector block 562 preferably also contains one or more fuses, together with fuse detect logic. Thus, fuses can be blown to irreversibly change the accessibility of the secure memory. This permits certain programmation and test options to be irreversibly terminated after initial testing and/or after the chip is programmed by a company which distributes smart-cards, but before shipment to customers.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Numerous variants are naturally possible. In particular, it is quite possible to use only one transistor to make the diode of each of the arms, although this is not as precise. Furthermore, it is also possible to invert the transistor N and P in each of the arms, or to use only one output state if the application relates to only one threshold. All these variants come within the scope of the invention.

For another example, although the presently preferred embodiment has been described in a 5V system, the innovative principles are not by any means limited to such a system.

As will be recognized by those skilled in the art, the innovative concepts described in the present application can be modified and varied over a tremendous range of applications, and accordingly the scope of patented subject matter is not limited by any of the specific exemplary teachings given.

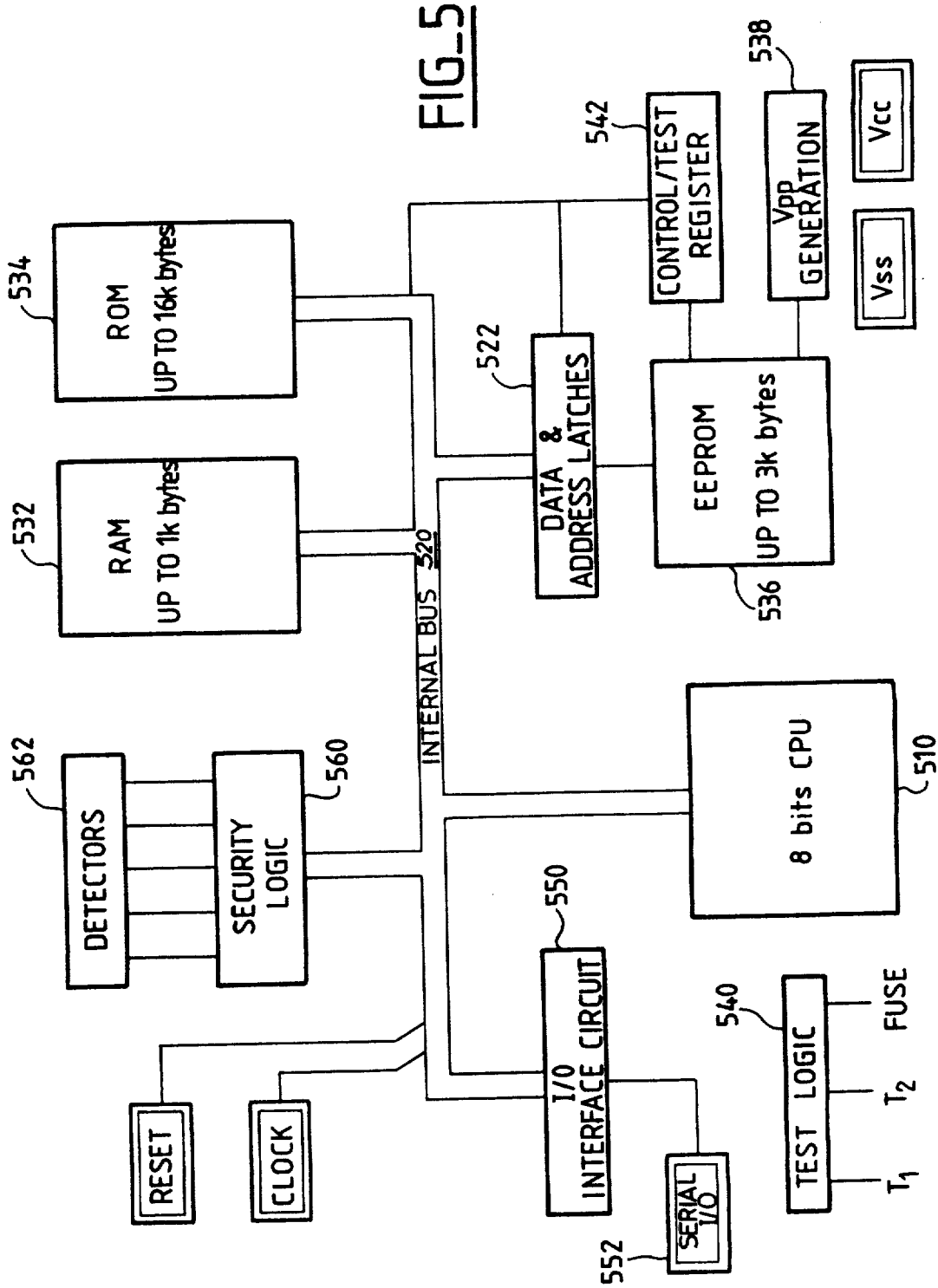

What is claimed is:

1. An integrated circuit, comprising:
    connections for first and second power supply voltages wherein said first power supply voltage is positive, and said second power supply voltage is ground;
    a first node connected to said first power supply voltage through a first constant-bias-potential element, and connected to said second power supply voltage through a first controlled current source;
    a second node connected to said second power supply voltage through a second constant-bias-potential element, and connected to said first power supply voltage through a second controlled current source;
    said first node being connected to control said second controlled current source, and said second node being connected to control said first controlled current source;
    first and second logic gates, having different respective threshold voltages, and connected to be driven by said first and second nodes respectively;
    whereby outputs of said first and second logic gates jointly indicate whether the difference between said first and second supply voltages is below, within, or above a predetermined range.

2. The integrated circuit of claim 1, wherein each said constant-bias-potential element comprises at least one diode-connected transistor.

3. The integrated circuit of claim 1, wherein each said constant-bias-potential element consists of a series of combination of two diode-connected field-effect transistors of opposite conductivity types.

4. The integrated circuit of claim 1, wherein each said constant-bias-potential element comprises at least two diodes in series.

5. The integrated circuit of claim 1, wherein each said controlled current source consists of a single field-effect transistor.

6. The integrated circuit of claim 1, wherein each said controlled current source comprises a field-effect transistor having a gate connected to a respective one of said nodes.

7. The integrated circuit of claim 1, wherein each said logic gate consists of an inverter.

8. An integrated circuit, comprising:
    connections for the first and second power supply voltages, wherein said first power supply voltage is positive, and said second power supply voltage is ground;
    a first node connected to said first power supply voltage through a first constant-bias-potential element, comprising two transistors of opposite conductivity types connected in series, and connected to said second power supply voltage through a first controlled current source;
    a second node connected to said second power supply voltage through a second constant-bias-potential element, comprising two transistors of opposite conductivity types connected in series, and connected to said first power supply voltage through a second controlled current source;
    said first node being connected to said control said second controlled current source, and said second node being connected to said control and first controlled current source;
    fist and second logic gates, having different respective threshold voltages, and connected to be driven by said first and second nodes respectively;
    whereby outputs of said first and second logic gates jointly indicate whether the difference between said first and second supply voltages is below, within, or above a predetermined range.

9. The integrated circuit of claim 8, wherein each said constant-bias-potential element consists of a series combination of two diode-connected field-effect transistors of opposite conductivity types.

10. The integrated circuit of claim 8, wherein each said controlled current source consists of a single field-effect transistor.

11. The integrated circuit of claim 8, wherein each said controlled current source comprises a field-effect transistor having a gate connected to a respective one of said nodes.

12. The integrated circuit of claim 8, wherein each said logic gate consists of an inverter.

13. A CMOS integrated circuit, comprising:
    connections for first and second power supply voltages, wherein said first power supply voltage is positive, and said second power supply voltage is ground;
    a first node connected to said first power supply voltage through a first diode-connected element comprising two field-effect transistors in series, and connected to said second power supply voltage through a first controlled current source:
    a second node connected to said second power supply voltage through a second diode-connected element comprising two field-effect transistors in series, and connected to said first power supply voltage through a second controlled current source;
    said second controlled current source including at least one PMOS transistor having a gate operatively connected to said first node, and said first controlled current source including at least one NMOS transistor having a gate operatively connected to said second node;

first and second logic gates, having different respective threshold voltages, and connected to be driven by said first and second nodes respectively;

whereby outputs of said first and second logic gates jointly indicate whether the difference between said first and second supply voltages is below, within, or above a predetermined range.

14. The integrated circuit of claim 13, wherein each said diode-connected element consists of a series combination of two diode-connected field-effect transistors of opposite conductivity types.

15. The integrated circuit of claim 13, wherein each said controlled current source consists of a single field-effect transistor.

16. The integrated circuit of claim 13, wherein each said logic gate consists of an inverter.

17. A circuit to detect the crossing of a threshold by a supply voltage, comprising:

a first arm including a forward biased diode between the input voltage and a first midpoint and a current generator between the first midpoint and the ground, a second arm including a current generator between the input voltage and a second midpoint and a forward biased diode between the second midpoint and the ground, and an output stage having a first and a second input connected respectively to the midpoint of said first and said second arm, the outputs of the output stage constituting the output of the circuit to detect the crossing of a threshold;

wherein the current generator of each arm is controlled in voltage by the midpoint of the other arm:

whereby the output of said output stage indicates whether the input voltage is below, within, or above a predetermined range.

18. A detection circuit according to claim 17, wherein the diode of an arm is constituted by two transistors of opposite types in series, each having its gate connected to its drain.

19. A detection circuit according to claim 17, wherein the current generator of one said arm is a transistor biased at a constant gate/source voltage.

20. A detection circuit according to claim 19, wherein the gate of the transistor forming the current generator of an arm is connected to the midpoint of the other arm.

21. A detection circuit according to claim 17, comprising an output stage, one input of which is connected to the midpoint of the other arm.

22. A detection circuit according to claim 21, comprising two outputs each capable of inhibiting the operation of other circuits placed on the same integrated circuit chip during the detection of a crossing of a voltage threshold by the input voltage of the circuit.

23. A detection circuit according to claim 17, wherein said output stage is an inverter.

24. A detection circuit according to claim 17, incorporated in an integrated circuit chip and comprising at least one output capable of inhibiting the operation of other circuits placed on the same integrated circuit chip in the event of detection of a crossing of a voltage threshold by the input voltage of the circuit.

25. A smart-card controller circuit, comprising:

a supply voltage monitoring circuit including:

connections for first and second power supply voltages, wherein said first power supply voltage is positive, and said second power supply voltage is ground:

a first node connected to said first power supply voltage through a first constant-bias-potential element, and connected to said second power supply voltage through a first controlled current source;

a second node connected to said second power supply voltage through a second constant-bias-potential element, and connected to said first power supply voltage through a second controlled current source;

said first node being connected to control said second controlled current source, and said second node being connected to control said first controlled current source;

first and second logic gates, having different respective threshold voltages, and connected to be driven by said first and second nodes respectively;

whereby outputs of said first and second logic gates jointly indicate whether the difference between said first and second supply voltages is below, within, or above a predetermined range;

security logic which is connected to monitor the outputs of said voltage monitoring circuit and provides output signals accordingly;

a rewritable nonvolatile memory; and a programmable CPU (central processing unit) which is connected to receive at least some ones of said output signals from said security logic, and which is connected to control access to said memory accordingly.

26. A smart-card controller circuit, comprising:

a supply voltage monitoring circuit including:

connections for first and second power supply voltages, wherein said first power supply voltage is positive, and said second power supply voltage is ground;

a first node connected to said first power supply voltage through a first constant-bias-potential element, and connected to said second power supply voltage through a first controlled current source;

a second node connected to said second power supply voltage through a second constant-bias-potential element, and connected to said first power supply voltage through a second controlled current source;

said first node being connected to control said second controlled current source, and said second node being connected to control said first controlled current source;

first and second logic gates, having different respective threshold voltages, and connected to be driven by said first and second nodes respectively;

whereby outputs of said first and second logic gates jointly indicate whether the difference between said first and second supply voltages is below, within, or above a predetermined range;

security logic which is connected to monitor the outputs of said voltage monitoring circuit and of said fuse, and provides output signals accordingly;

a read-only memory;

a rewritable nonvolatile memory; and a programmable CPU (central processing unit) which is connected to execute programs from said read-only memory, and which is connected to receive at least some ones of said output signals from said security logic, and which is connected to control access to said rewriteable nonvolatile memory accordingly.

27. A smart-card controller circuit, comprising:

a supply voltage monitoring circuit including:

connections for first and second power supply voltages, wherein said first power supply voltage is positive, and said second power supply voltage is ground;

a first node connected to said first power supply voltage through a first constant-bias-potential element, comprising two transistors of opposite conductivity types connected in series, and connected to said second power supply voltage through a first controlled current source;

a second node connected to said second power supply voltage through a second constant-bias-potential element, comprising two transistors of opposite conductivity types connected in series, and connected to said first power supply voltage through a second controlled current source;

said first node being connected to said control said second controlled current source, and said second node being connected to said control said first controlled current source;

first and second logic gates having different respective threshold voltages, and connected to be driven by said first and second nodes respectively;

whereby outputs of said first and second logic gates jointly indicate whether the difference between said first and second supply voltages is below, within, or above a predetermined range;

security logic which is connected to monitor the outputs of said voltage monitoring circuit and provides output signals accordingly;

a rewritable nonvolatile memory; and a programmable CPU (central processing unit) which is connected to receive at least some ones of said output signals from said security logic, and which is connected to control access to said memory accordingly.

28. A smart-card controller circuit, comprising:

a supply voltage monitoring circuit including:

connections for first and second power supply voltages, wherein said first power supply voltage is positive, and said second power supply voltage is ground;

a first node connected to said first power supply voltage through a first constant-bias-potential element, comprising two transistors of opposite conductivity types connected in series, and connected to said second power supply voltage through a first controlled current source;

a second node connected to said second power supply voltage through a second constant-bias-potential element, comprising two transistors of opposite conductivity types connected in series, and connected to said first power supply voltage through a second controlled current source;

said first node being connected to said control said second controlled current source, and said second node being connected to said control said first controlled current source;

first and second logic gates, having different respective threshold voltages, and connected to be driven by said first and second nodes respectively;

whereby outputs of said first and second logic gates jointly indicate whether the difference between said first and second supply voltages is below, within, or above a predetermined range;

security logic which monitors the outputs of said voltage monitoring circuit and of said fuse, and provides output signals accordingly;

a read-only memory;

a rewritable nonvolatile memory; and a programmable CPU (central processing unit) which is connected to execute programs from said read-only memory, and which is connected to receive at least some ones of said output signals from said security logic, and which is connected to control access to said rewriteable nonvolatile memory accordingly.

29. A method for detecting power-supply overvoltage and undervoltage, comprising the steps of:

sourcing current from a first power supply voltage through a first constant-bias-potential element to a first controlled current source which is connected to a second power supply voltage, wherein said first power supply voltage is positive and said second power supply voltage is ground;

sourcing current from said first power supply voltage through a second controlled current source to a second constant-bias-potential element which is connected to said second power supply voltage;

controlling the current of said second current source by a voltage taken from a first node which is intermediate between said first current source and said first constant-bias-potential element;

controlling the current of said first current source by a voltage taken from a second node which is intermediate between said second current source and said second constant-bias-potential element;

driving first and second logic gates with the respective voltages of said first and second nodes, said first and second logic gates having different respective threshold voltages; and connecting the respective outputs of said first and second logic gates to indicate whether the difference between said first and second supply voltages is below, within, or above a predetermined range.

* * * * *

UNITED STATES PATENT AND TRADEMARK OFFICE
CERTIFICATE OF CORRECTION

PATENT NO. : 5,602,500

DATED : February 11, 1997

INVENTOR(S) : Fournel

It is certified that error appears in the above-identified patent and that said Letters Patent is hereby corrected as shown below:

The title page, showing an illustrative figure, should be deleted and substitute therefor the attached title page.

Delete Drawings sheets 1-6, and substitute therefor the Drawing sheets, consisting of Figs. 1-5, as shown on the attached pages.

Signed and Sealed this

Twenty-first Day of April, 1998

Attest:

BRUCE LEHMAN

*Attesting Officer*  *Commissioner of Patents and Trademarks*

United States Patent [19]

Fournel

[11] Patent Number: 5,602,500
[45] Date of Patent: Feb. 11, 1997

[54] CIRCUIT FOR THE DETECTION OF VOLTAGE THRESHOLDS

[75] Inventor: Richard P. Fournel, Trets, France

[73] Assignee: SGS-Thomson Microelectronics, S. A., Gentilly Cedex, France

[21] Appl. No.: 54,939

[22] Filed: Apr. 28, 1993

[30] Foreign Application Priority Data

Apr. 30, 1992 [FR] France ............................ 92 05418

[51] Int. Cl.⁶ .............................................. H03K 1/12
[52] U.S. Cl. ........................... 327/77; 327/530; 327/576; 327/78; 327/79; 327/50; 327/63; 327/81; 327/55; 327/143
[58] Field of Search ............................ 307/354, 296.7, 307/296.6, 296.1, 296.4, 296.5; 327/79, 78, 80, 81, 20, 55, 58, 59, 62, 63, 77, 50, 530, 541, 546, 143, 535, 576

[56] References Cited

U.S. PATENT DOCUMENTS

| | | | |
|---|---|---|---|
| 3,508,081 | 4/1970 | Matsuda | 307/296.6 |
| 3,681,623 | 8/1972 | Hoffman, Jr. et al. | 307/296.8 |
| 3,733,498 | 5/1973 | Watson et al. | 307/296.6 |
| 4,558,232 | 12/1985 | Simpson | 307/354 |
| 4,857,769 | 8/1989 | Kotera et al. | 307/450 |
| 4,983,857 | 1/1991 | Steele | 307/272.3 |
| 5,140,183 | 8/1992 | Takenaka | 307/296.4 |

Primary Examiner—Timothy P. Callahan
Assistant Examiner—Dinh T. Le
Attorney, Agent, or Firm—Betty Formby; Robert Groover

[57] ABSTRACT

A circuit to detect the crossing of at least one voltage threshold by an input voltage of an integrated circuit has two arms mounted in negative feedback configuration, each comprising a forward biased diode in series with a current generator. The current generator of an arm is controlled in voltage by the other arm. An inverter calibrated to detect a crossing of a given threshold is connected at input to the connection point between the diode and the generator of one of the arms.

29 Claims, 6 Drawing Sheets

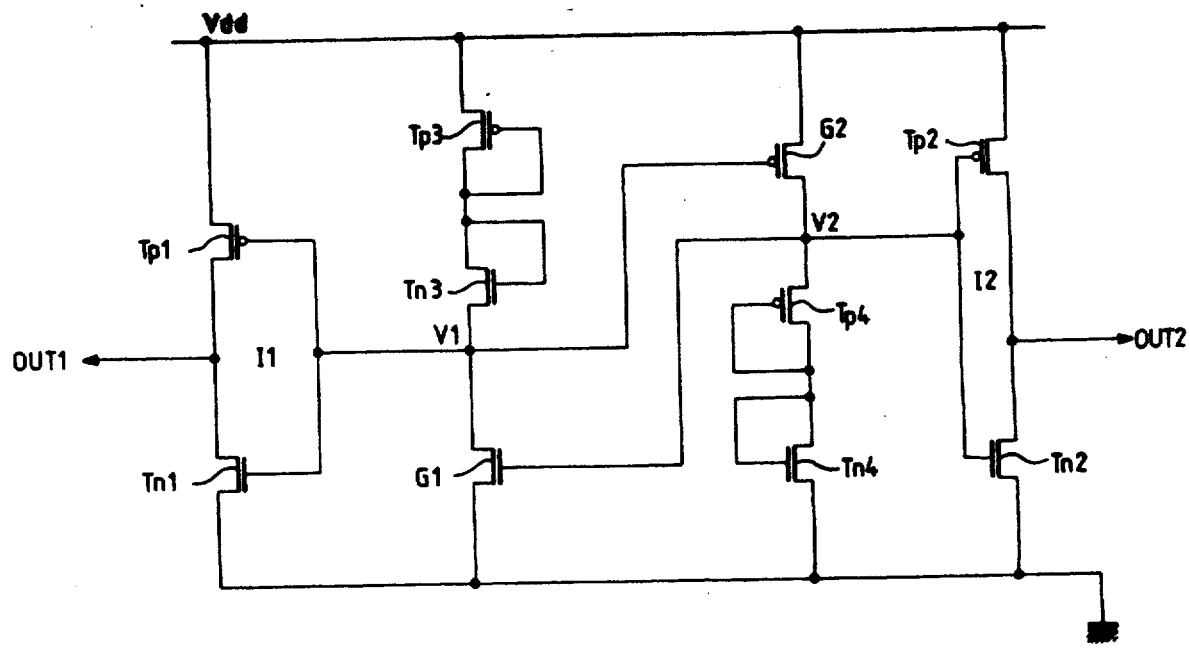

FIG_1
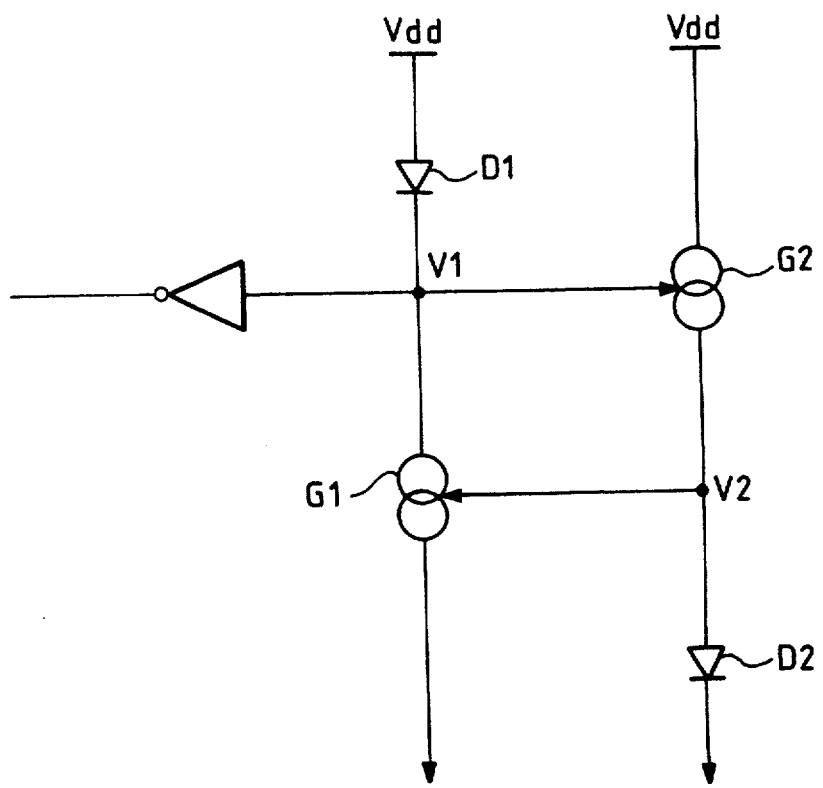

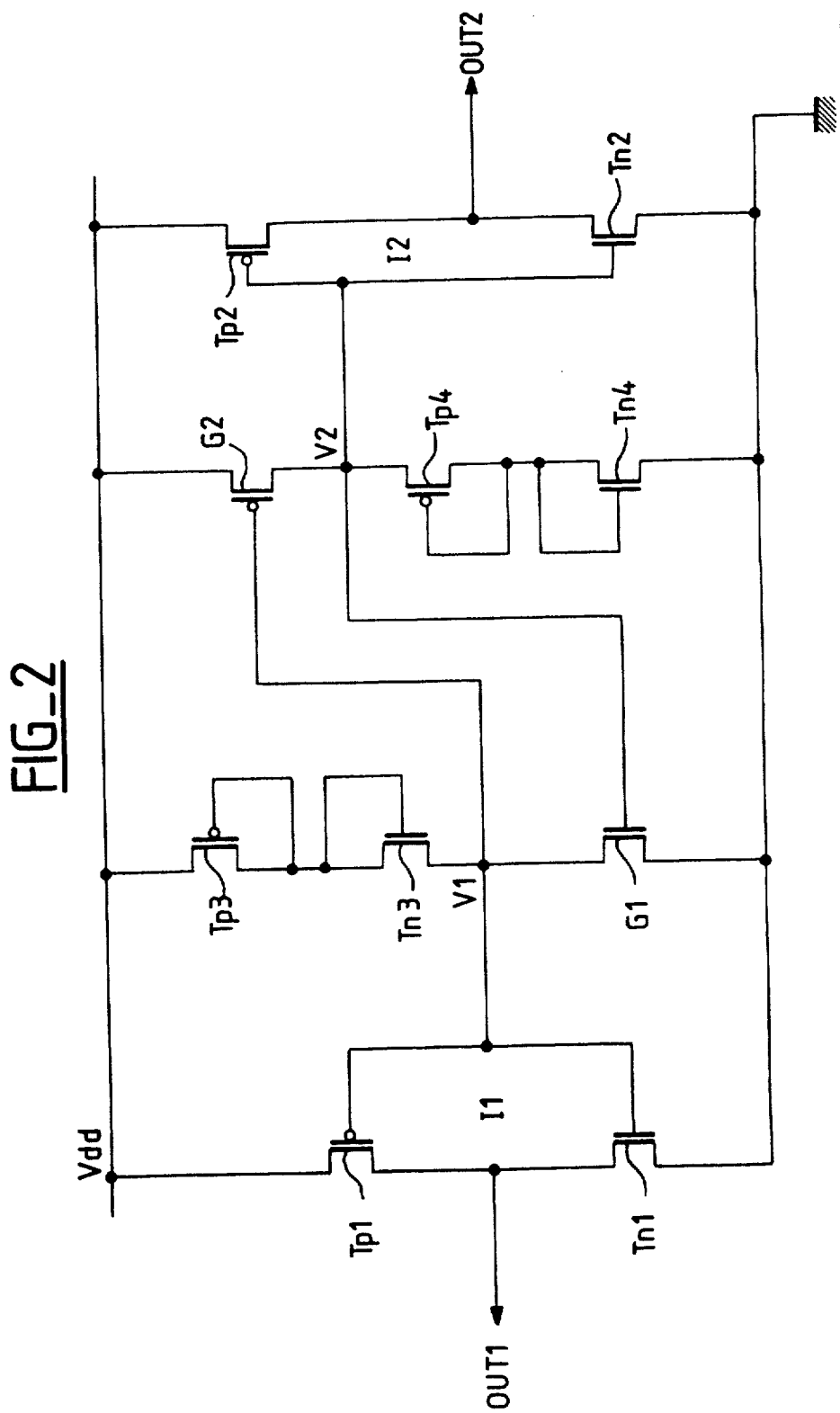
FIG_2

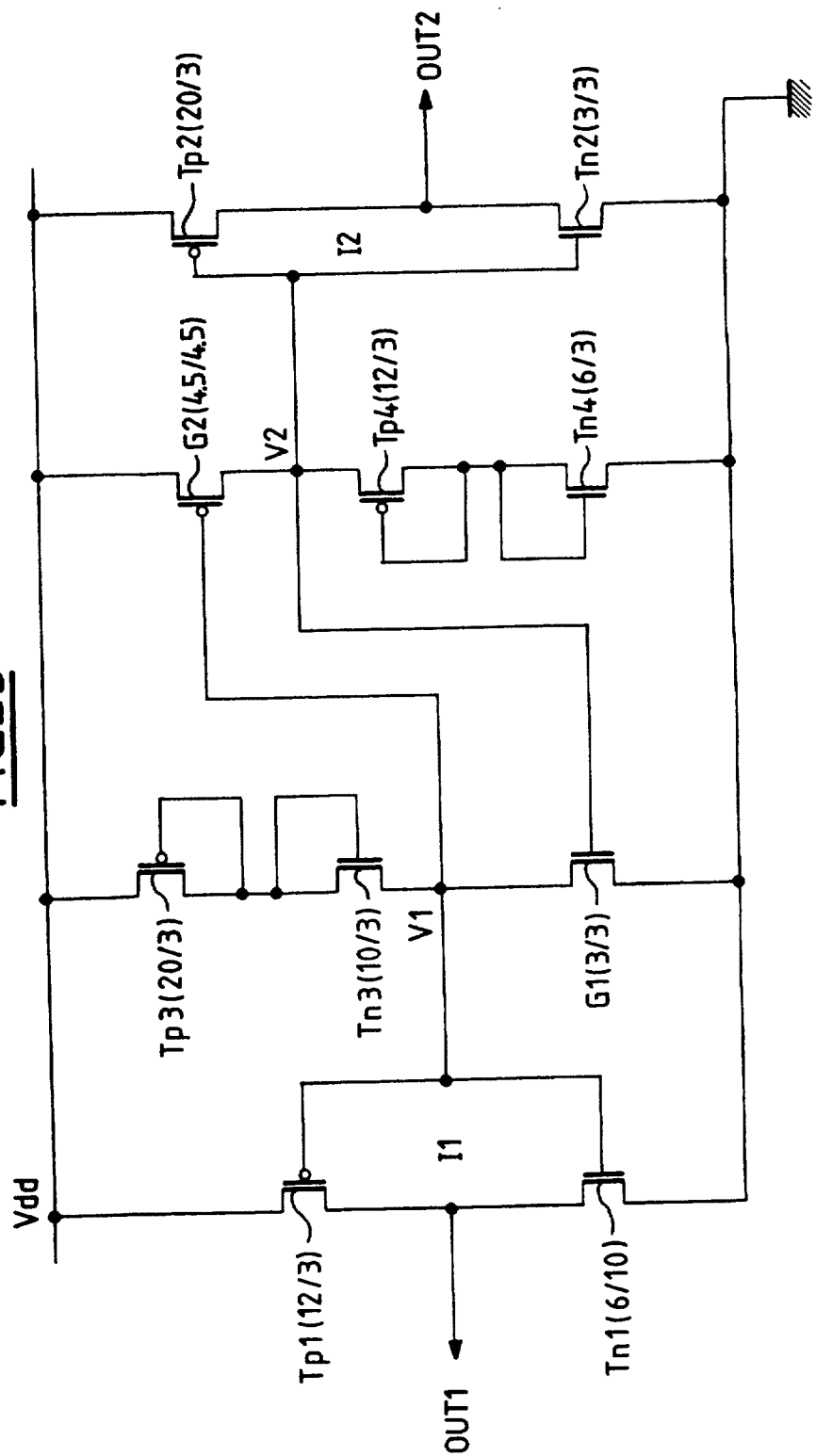
FIG_3